United States Patent
Yabe et al.

(10) Patent No.: US 10,847,615 B2
(45) Date of Patent: Nov. 24, 2020

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tomoaki Yabe, Tokyo (JP); Mitsuhiro Yano, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/352,271

(22) Filed: Mar. 13, 2019

(65) Prior Publication Data

US 2020/0098864 A1 Mar. 26, 2020

(30) Foreign Application Priority Data

Sep. 20, 2018 (JP) .................................. 2018-175702

(51) Int. Cl.
*H01L 29/10* (2006.01)
*H01L 23/367* (2006.01)
(Continued)

(52) U.S. Cl.
CPC ........ *H01L 29/1033* (2013.01); *H01L 23/367* (2013.01); *H01L 23/528* (2013.01); *H01L 23/5226* (2013.01); *H01L 29/785* (2013.01)

(58) Field of Classification Search
CPC ... H01L 23/36; H01L 23/367; H01L 23/3672; H01L 23/3677; H01L 23/5226; H01L 23/528; H01L 29/0673
See application file for complete search history.

(56) References Cited

U.S. PATENT DOCUMENTS

2011/0215457 A1 9/2011 Park
2018/0175035 A1* 6/2018 Yang ................. H01L 29/66439
(Continued)

FOREIGN PATENT DOCUMENTS

JP 2013-521661 A 6/2013
JP 5315688 B2 10/2013
JP 5710918 B2 4/2015

OTHER PUBLICATIONS

N. Loubert, et al., "Stacked Nanosheet Gate-All-Around Transistor to Enable Scaling Beyond FinFET", 2017 Symposium on VLSI Technology Digest of Technical Papers, (2017), pp. T230-1231.

*Primary Examiner* — David C Spalla
(74) *Attorney, Agent, or Firm* — White & Case LLP (57) ABSTRACT

A semiconductor device includes a substrate; a first semiconductor layer above the substrate, a second semiconductor layer between the substrate and the first semiconductor layer, first and second conductors, an electrode, and first and second insulating films. The first and second semiconductor layers have a first end and a second end opposite to the first end. The first conductor is connected to the first ends of the first and second semiconductor layers. The second conductor includes a first portion connected to the second ends of the first and second semiconductor layers and a second portion positioned inside the substrate. The electrode faces portions of first and second semiconductor layers between the first end and the second end thereof. The first insulating film is provided between the first semiconductor layer and the electrode; and the second insulating film is provided between the second semiconductor layer and the electrode.

13 Claims, 6 Drawing Sheets

(51) Int. Cl.
*H01L 23/522* (2006.01)
*H01L 23/528* (2006.01)
*H01L 29/78* (2006.01)

(56) References Cited

U.S. PATENT DOCUMENTS

| | | | |
|---|---|---|---|
| 2019/0067125 A1* | 2/2019 | Chiang | H01L 29/66772 |
| 2019/0096996 A1* | 3/2019 | Song | H01L 27/0886 |
| 2019/0131394 A1* | 5/2019 | Reznicek | H01L 21/823828 |
| 2019/0131431 A1* | 5/2019 | Cheng | H01L 29/42392 |
| 2019/0148515 A1* | 5/2019 | Cheng | H01L 29/42376 |
| | | | 257/347 |

* cited by examiner

SEMICONDUCTOR DEVICE

CROSS-REFERENCE TO RELATED APPLICATIONS

This application is based upon and claims the benefit of priority from Japanese Patent Application No. 2018-175702, filed on Sep. 20, 2018; the entire contents of which are incorporated herein by reference.

FIELD

Embodiments relate to a semiconductor device.

BACKGROUND

A FinFET is known in which the footprint on the wafer is extremely reduced; but enlargement of the channel width is limited in the FinFET. It is desirable for the next-generation MOSFETs (Metal Oxide Semiconductor Field Effect Transistors) to further enlarge the channel width.

DETAILED DESCRIPTION

According to an embodiment, a semiconductor device includes a substrate; a first semiconductor layer provided above the substrate, the first semiconductor layer extending in a first direction along a surface of the substrate and having a first end and a second end opposite to the first end; a second semiconductor layer disposed between the substrate and the first semiconductor layer, the second semiconductor layer extending in the first direction and having a first end and a second end opposite to the first end; a first conductor connected to the first end of the first semiconductor layer and the first end of the second semiconductor layer, the first conductor extending in a second direction crossing the surface of the substrate; a second conductor extending in the second direction and including a first portion and a second portion, the first portion being connected to the second end of the first semiconductor layer and being connected to the second end of the second semiconductor layer, the second portion being positioned inside the substrate; an electrode facing a portion between the first end and the second end of the first semiconductor layer and facing a portion between the first end and the second end of the second semiconductor layer; a first insulating film provided between the first semiconductor layer and the electrode; and a second insulating film provided between the second semiconductor layer and the electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
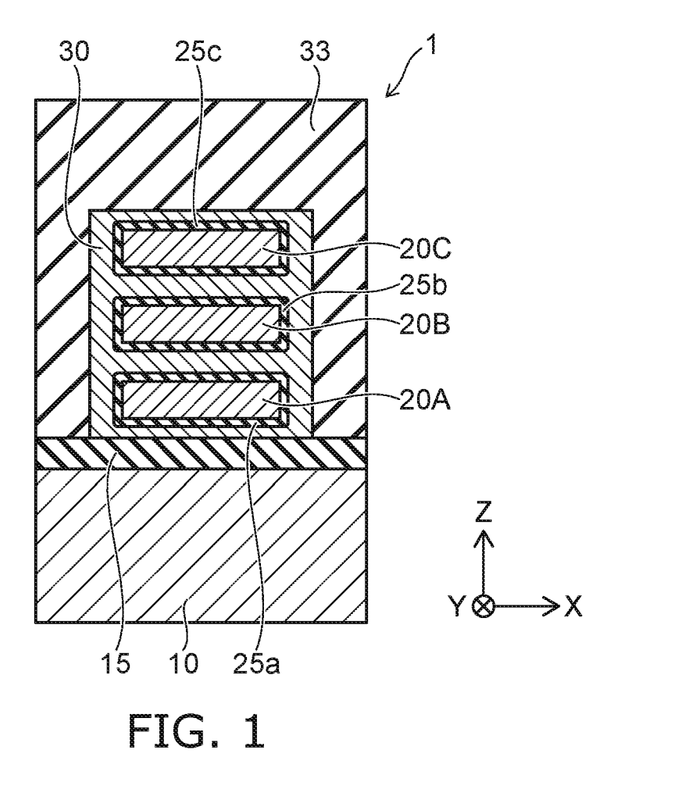
FIG. 1 is a schematic cross-sectional view showing a semiconductor device according to an embodiment.

FIG. 1 is a schematic cross-sectional view showing a semiconductor device 1 according to an embodiment. The semiconductor device 1 is a MOSFET including multiple semiconductor layers 20 (hereinbelow, the semiconductor layers 20A, 20B, and 20C) stacked above a substrate 10. In the description hereinbelow, there are cases where the semiconductor layers 20A, 20B, and 20C are described individually and cases where the semiconductor layers 20A, 20B, and 20C are described comprehensively as the semiconductor layer 20. The other components are also described in the same manner.

As shown in FIG. 1, the semiconductor layers 20A, 20B, and 20C are arranged in the Z-direction; and the Z-direction crosses the upper surface of the substrate 10. The semiconductor layers 20A, 20B, and 20C each are provided to extend in the Y-direction along the upper surface of the substrate 10.

The substrate 10 is, for example, a p-type silicon substrate. The substrate 10 may be a p-type silicon layer that is provided on a silicon substrate. The semiconductor layers 20A, 20B, and 20C are, for example, polysilicon layers.

The semiconductor device 1 further includes gate insulating films 25a, 25b, and 25c and a gate electrode 30. For example, the gate electrode 30 is provided to surround the semiconductor layers 20A, 20B, and 20C in a cross section parallel to the X-Z plane. The gate electrode 30 includes, for example, a metal such as tungsten (W), etc.

The gate insulating film 25a is provided between the semiconductor layer 20A and the gate electrode 30. The gate insulating film 25b is provided between the semiconductor layer 20B and the gate electrode 30. The gate insulating film 25c is provided between the semiconductor layer 20C and the gate electrode 30. The gate insulating films 25a, 25b, and 25c are, for example, silicon oxide films. The gate insulating films 25a, 25b, and 25c electrically insulate the semiconductor layers 20A, 20B, and 20C from the gate electrode 30.

The semiconductor device 1 further includes an insulating film 15 and an insulating film 33. The insulating film 15 is provided between the substrate 10 and the gate electrode 30. The insulating film 15 is, for example, a silicon oxide film and covers the surface of the substrate 10. The insulating film 15 electrically insulates the gate electrode 30 from the substrate 10. The insulating film 33 is provided to cover the semiconductor layers 20A, 20B, and 20C and the gate electrode 30 on the insulating film 15. The insulating film 33 is, for example, a silicon oxide film.

Figure 2A:
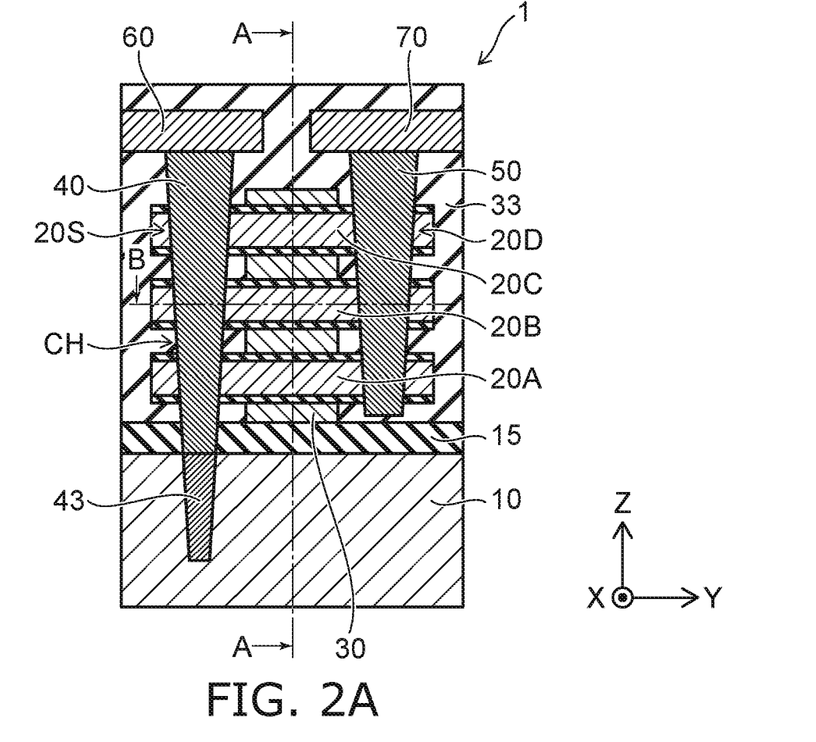
FIGS. 2A and 2B are schematic views showing the semiconductor device according to the embodiment.
Figure 2B:
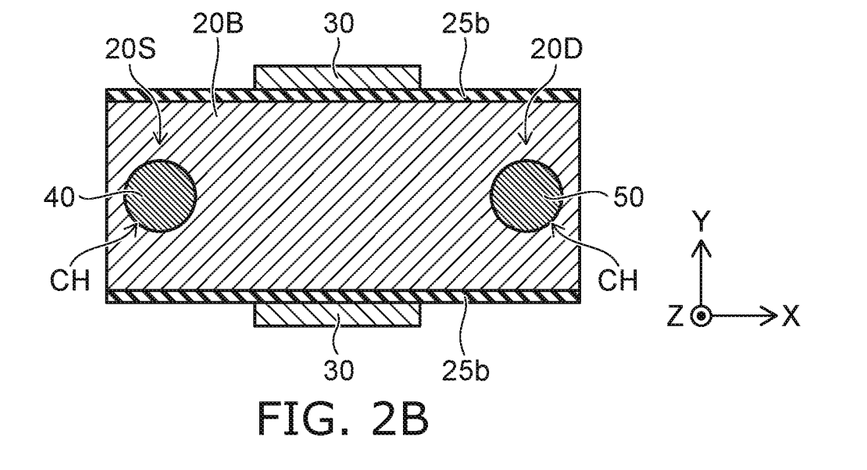

FIGS. 2A and 2B are schematic views showing the semiconductor device 1 according to the embodiment. FIG. 2A is a schematic view showing a cross section parallel to the Z-Y plane of the semiconductor device 1. FIG. 2B is a schematic view showing a cross section along line B-B shown in FIG. 2A. FIG. 1 is a schematic view illustrating a cross section along line A-A shown in FIG. 2A.

As shown in FIG. 2A, the semiconductor device 1 further includes a contact plug 40 and a contact plug 50. The contact plugs 40 and 50 extend in the Z-direction through the insulating film 33. The contact plugs 40 and 50 are, for example, conductors including a metal such as tungsten (W), etc.

For example, the contact plug 40 is provided to contact source ends 20S of the semiconductor layers 20A, 20B, and 20C. The contact plug 40 is electrically connected to the semiconductor layers 20A, 20B, and 20C. For example, the contact plug 40 is connected to an interconnect 60 disposed above the contact plug 40. Here, "electrically connected" includes the case of a direct connection and the case of a connection via another conductor. This is similar for the following description as well.

For example, the contact plug 50 is provided to contact drain ends 20D of the semiconductor layers 20A, 20B, and 20C. The contact plug 50 is electrically connected to the semiconductor layers 20A, 20B, and 20C.

The contact plug 50 is electrically insulated from the substrate 10 with the insulating film 15 interposed. The insulating film 15 includes a portion positioned between the substrate 10 and the contact plug 50. Also, for example, the contact plug 50 is connected to an interconnect 70 disposed above the contact plug 50.

The interconnects 60 and 70 include, for example, a metal such as tungsten (W), etc. The contact plugs 40 and 50 include, for example, the same metal material as the materials of the interconnects 60 and 70. The contact plug 40 may be formed as one body with the interconnect 60. Also, for example, the contact plug 50 may be formed as one body with the interconnect 70. The interconnects 60 and 70 may be so-called damascene interconnects.

The semiconductor device 1 further includes a metal plug 43. The metal plug 43 is provided in the substrate 10. For example, the metal plug 43 is positioned directly under the contact plug 40. For example, the contact plug 40 extends through the insulating film 15 and is connected to the metal plug 43. The metal plug 43 may include, for example, the same metal material as the material of the contact plug 40 or may include a different metal material from the material of the contact plug 40. For example, the metal plug 43 is provided to directly contact the substrate 10.

As shown in FIG. 2B, the contact plugs 40 and 50 are provided to extend through the source end 20S and the drain end 20D of the semiconductor layer 20B. The contact plugs 40 and 50 are provided to extend through the source ends 20S and the drain ends 20D of the semiconductor layers 20A and 20C at not-illustrated portions.

The contact plugs 40 and 50 are formed inside contact holes CH extending in the Z-direction through the insulating film 33. For example, the contact holes CH are provided inside the insulating film 33 using RIE (Reactive Ion Etching). In such a case, the contact holes CH are formed to extend through the source ends 20S and the drain ends 20D of the semiconductor layers 20A, 20B, and 20C.

In the semiconductor device 1, the Joule heat that is generated by the drain current flowing through the semiconductor layers 20A, 20B, and 20C is dissipated to the substrate 10 via the contact plug 40 and the metal plug 43. Thereby, the degradation of the MOS characteristics due to self-heating can be suppressed.

Figure 3A:
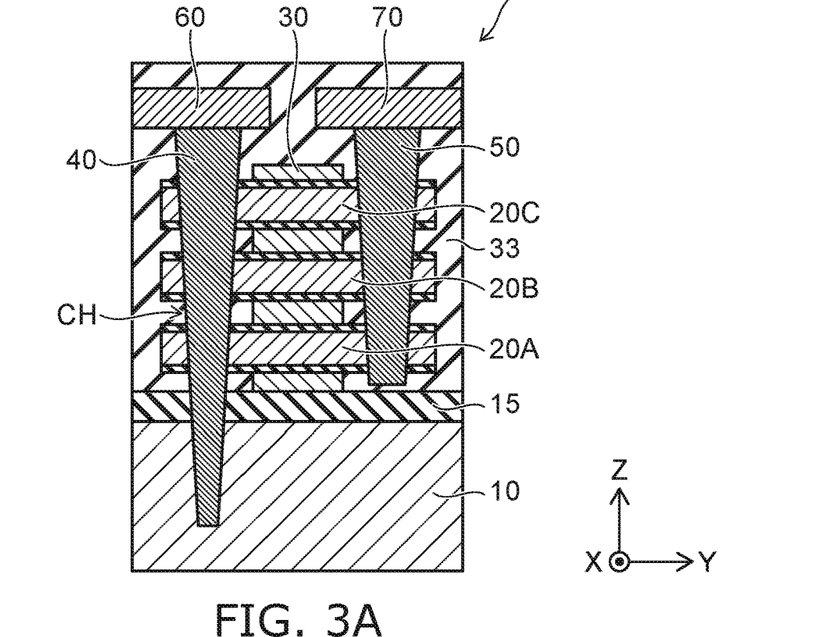
FIGS. 3A and 3B are schematic cross-sectional views showing semiconductor devices according to modifications of the embodiment.
Figure 3B:
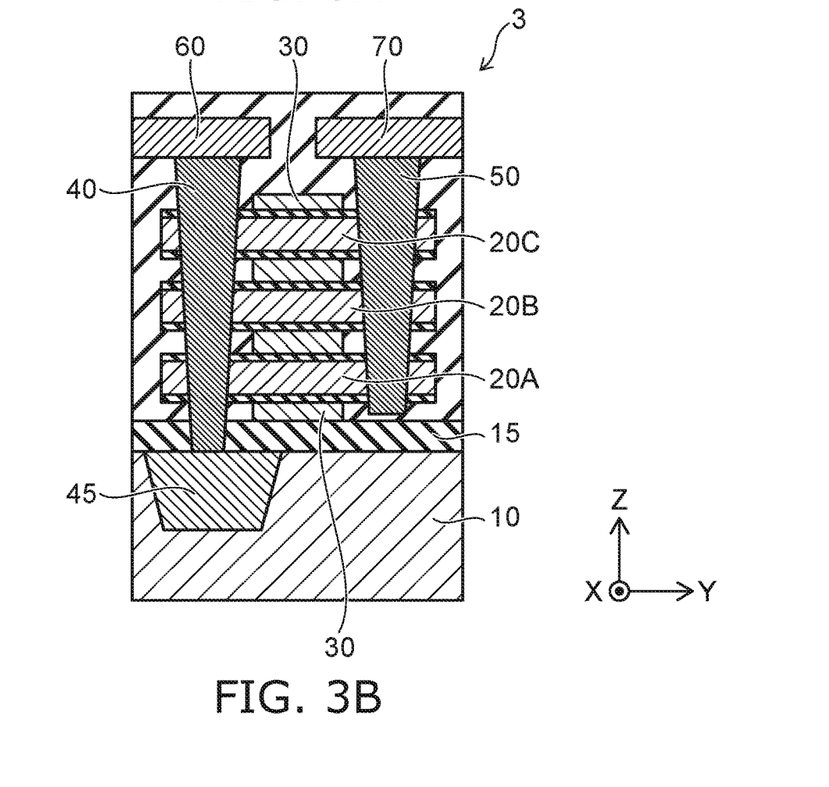

FIGS. 3A and 3B are schematic cross-sectional views showing semiconductor devices 2 and 3 according to modifications of the embodiment. FIGS. 3A and 3B are schematic views showing cross sections corresponding to FIG. 2A.

The contact plug 40 of the semiconductor device 2 shown in FIG. 3A has a length capable of extending through the insulating film 33 and the insulating film 15 and reaching the substrate 10. The lower end of the contact plug 40 is positioned in the substrate 10.

For example, the contact plug 40 is formed in the contact hole CH having a depth capable of reaching the substrate 10.

The contact plug 40 is, for example, one body of a conductor including a metal such as tungsten (W), etc. For example, the contact plug 40 is provided to contact the semiconductor layers 20A, 20B, and 20C and the substrate 10. The Joule heat that is generated in the semiconductor layers 20A, 20B, and 20C is dissipated to the substrate 10 via the contact plug 40. Thus, for example, the contact plug 40 may be provided as one body with the metal plug 43, may extend through the insulating film 15, and may be provided to extend into the substrate 10.

The semiconductor device 3 shown in FIG. 3B includes a heat sink 45 provided inside the substrate 10. The heat sink 45 includes, for example, a metal material having a high thermal conductivity such as copper (Cu), etc. For example, inside the substrate 10, the heat sink 45 has a volume larger than that of the metal plug 43. For example, the heat sink 45 is electrically insulated from the gate electrode 30 by the insulating film 15. The contact plug 40 extends through the insulating film 15 and is connected to the heat sink 45.

By providing the heat sink 45 in the semiconductor device 3, the heat dissipation via the contact plug 40 can be promoted; and the temperature increase of the semiconductor layers 20A, 20B, and 20C can be suppressed further.

Figure 4A:
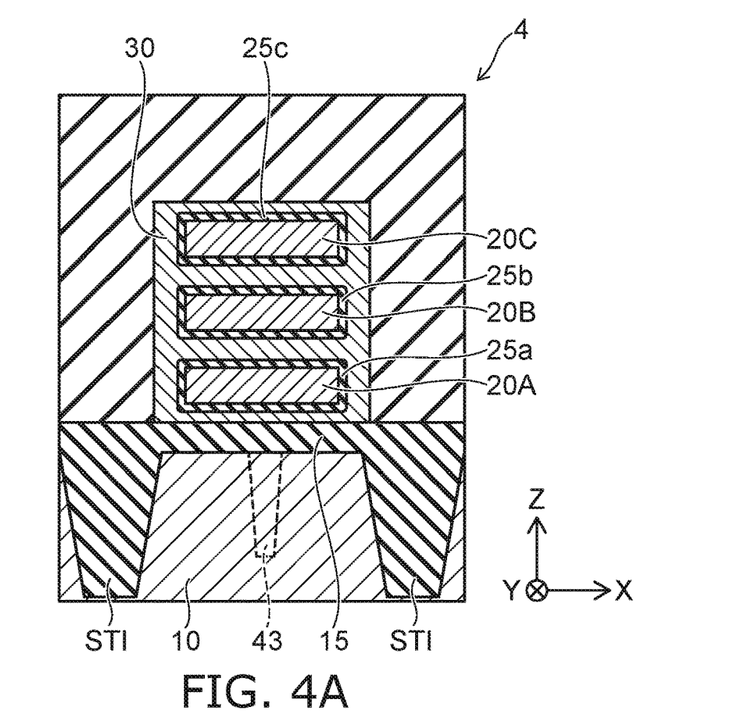
FIGS. 4A and 4B are schematic views showing a semiconductor device according to other modification of the embodiment.
Figure 4B:
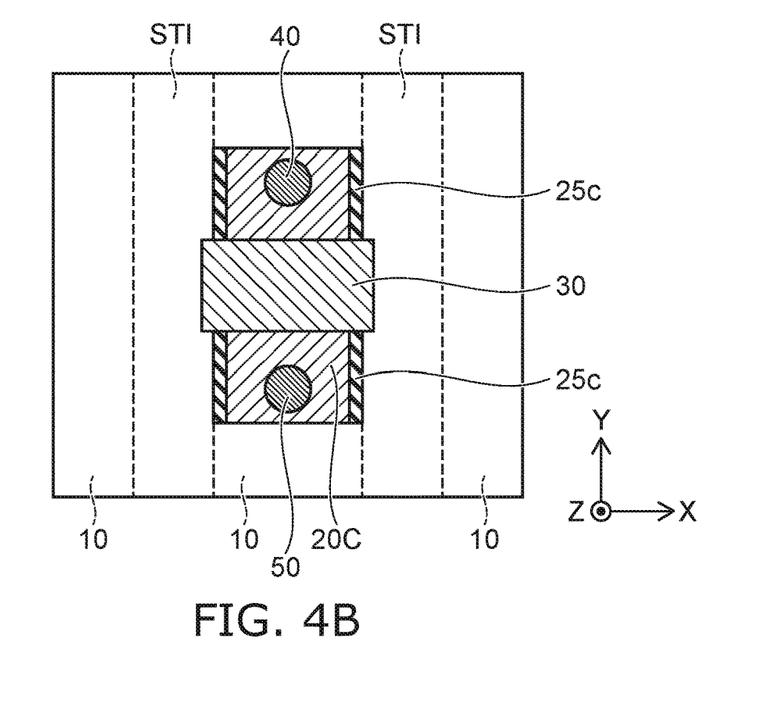

FIGS. 4A and 4B are schematic views showing a semiconductor device 4 according to other modification of the embodiment. FIG. 4A is a schematic view showing a cross section corresponding to FIG. 1. FIG. 4B is a schematic view showing the arrangement of the semiconductor layer 20C and the gate electrode 30 when viewed from above.

As shown in FIG. 4A, the semiconductor device 4 includes STI (Shallow Trench Isolation) provided in the substrate 10. As shown in FIG. 4B, for example, the STI extends in the Y-direction and is provided to subdivide the surface layer of the substrate 10. The STI is, for example, a silicon oxide film and is filled into a trench provided in the substrate 10.

The semiconductor layers 20A, 20B, and 20C are provided on the surface layer of the substrate 10 subdivided by the STI. The semiconductor layers 20A, 20B, and 20C extend in the Y-direction; and the contact plugs 40 and 50 are provided to contact the end surfaces of the semiconductor layers 20A, 20B, and 20C crossing the Y-direction. The metal plug 43 is provided in the surface layer of the substrate 10 subdivided by the STI.

For example, the semiconductor devices 1 are multiply disposed on the substrate 10. Then, for example, the source contacts of the semiconductor devices 1 adjacent to each other in the X-direction are electrically isolated by the STI.[**]

Figure 5:
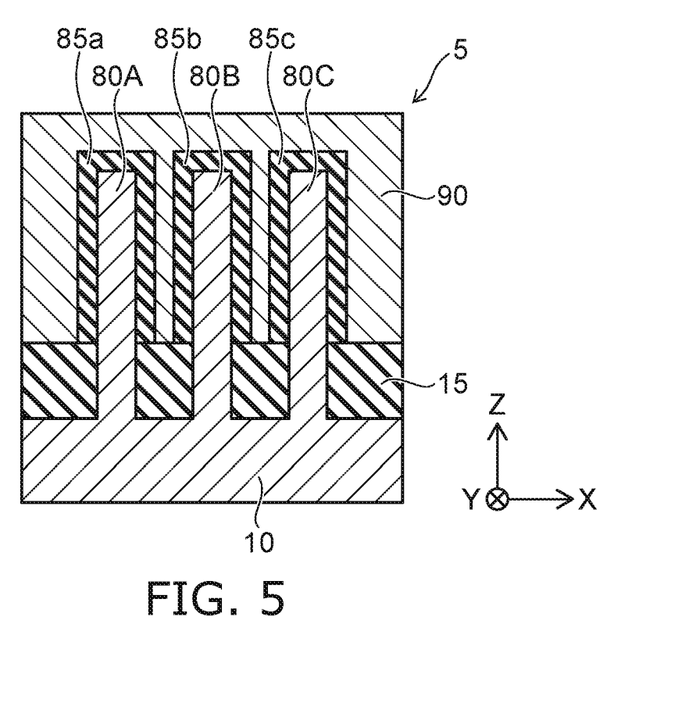
FIG. 5 is a schematic cross-sectional view showing a semiconductor device 5 according to a comparative example.

FIG. 5 is a schematic cross-sectional view showing a semiconductor device 5 according to a comparative example. The semiconductor device 5 is, for example, a FinFET and includes semiconductor portions 80A, 80B, and 80C that are formed into the fin configurations and provided in the substrate 10.

For example, the semiconductor portions 80A, 80B, and 80C are formed by selectively removing the surface layer of the substrate 10. For example, the semiconductor portions 80A, 80B, and 80C extend in the Y-direction. For example, the semiconductor portions 80A, 80B, and 80C are provided to have heights of about 10 nanometers. For example, the semiconductor portions 80A, 80B, and 80C are provided to have an arrangement pitch in the X-direction of about 5 nanometers.

The semiconductor device 5 further includes gate insulating films 85a, 85b, and 85c and a gate electrode 90.

The gate electrode 90 is provided to cover the upper surfaces and the side surfaces of the semiconductor portions 80A, 80B, and 80C. The gate insulating film 85a is provided between the semiconductor portion 80A and the gate electrode 90. The gate insulating film 85b is provided between the semiconductor portion 80B and the gate electrode 90. The gate insulating film 85c is provided between the semiconductor portion 80C and the gate electrode 90.

The semiconductor device 5 further includes, for example, a source contact (not-illustrated) and a drain contact (not-illustrated). The source contact and the drain contact are arranged in the Y-direction and are electrically connected to the two end surfaces of the semiconductor portions 80A, 80B, and 80C.

For example, the semiconductor device 5 has a channel width that is the sum total of the length of the interface between the semiconductor portion 80A and the gate insulating film 85a in the X-Z cross section, the length of the interface between the semiconductor portion 80B and the gate insulating film 85b in the X-Z cross section, and the length of the interface between the semiconductor portion 80C and the gate insulating film 85c in the X-Z cross section.

To widen the channel width in the semiconductor device 5, for example, it is sufficient to increase the number of the semiconductor portions 80 covered with the gate electrode 90. However, the size of the semiconductor portion 80 in the FinFET is downscaled to, for example, the same level as the resolution limit of the photolithography. Accordingly, it is difficult to reduce the size of the semiconductor portion 80. Therefore, in the case where the number of the semiconductor portions is increased to widen the channel width of the semiconductor device 5, the size in the X-direction also increases. In other words, it is difficult to widen the channel width per unit area in the wafer surface.

In contrast, in the semiconductor devices 1 to 4 according to the embodiment, the channel width can be widened by increasing the number of stacks of the semiconductor layers 20. In other words, the channel width can be widened without increasing the footprint of the semiconductor devices 1 to 4 on the wafer.

In the semiconductor devices 1 to 4, for example, the semiconductor layer 20 is provided to have sizes in the X-direction and the Y-direction of about several nanometers. In other words, this is a size near the limit of two-dimensional downscaling using photolithography. Thus, in the semiconductor devices 1 to 4, even in the case where the footprint on the wafer is reduced to a size near the limit, the channel width per unit area can be widened; and the current driving capability can be increased.

Figure 6A:
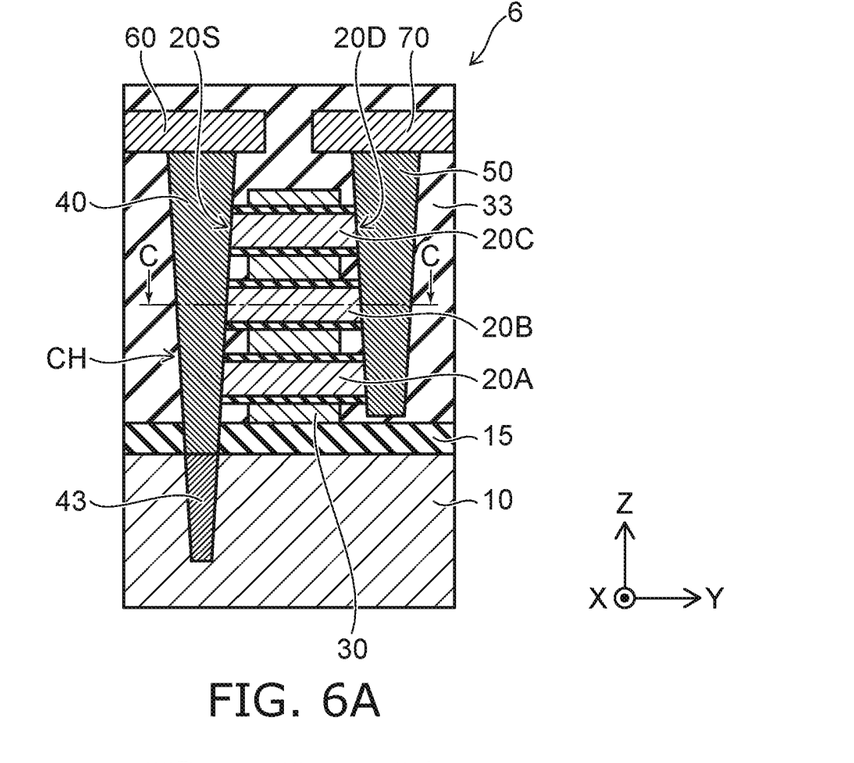
FIGS. 6A and 6B are schematic views showing a semiconductor device according to yet other modification of the embodiment.
Figure 6B:
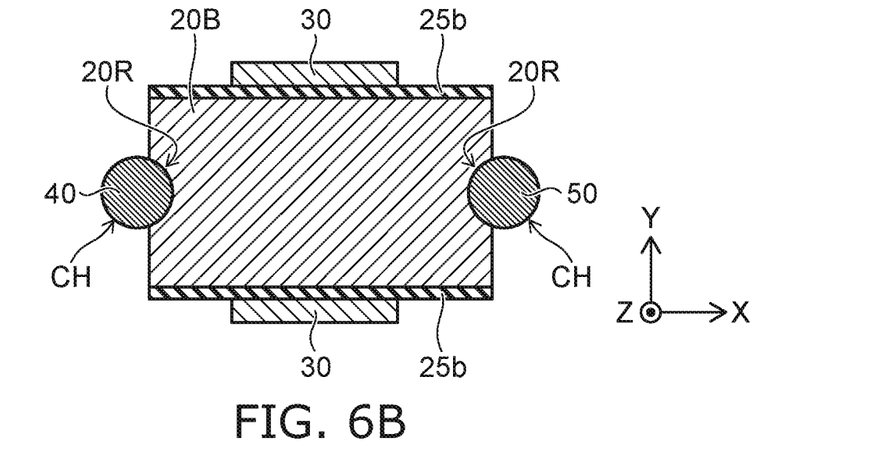

FIGS. 6A and 6B are schematic views showing a semiconductor device 6 according to yet other modification of the embodiment. FIG. 6A is a schematic view showing a cross section parallel to the Z-Y plane of the semiconductor device 6. FIG. 6B is a schematic view showing a cross section along line C-C shown in FIG. 6A.

As shown in FIG. 6A, the semiconductor device 6 includes the contact plug 40 and the contact plug 50.

For example, the contact plug 40 is provided to contact the source ends 20S of the semiconductor layers 20A, 20B, and 20C. The contact plug 40 is electrically connected to the semiconductor layers 20A, 20B, and 20C. For example, the contact plug 40 is connected to the interconnect 60 disposed above the contact plug 40. For example, the contact plug 40 extends through the insulating film 15 and is connected to the metal plug 43 provided inside the substrate 10.

For example, the contact plug 50 is provided to contact the drain ends 20D of the semiconductor layers 20A, 20B, and 20C. The contact plug 50 is electrically connected to the semiconductor layers 20A, 20B, and 20C. Also, for example, the contact plug 50 is connected to the interconnect 70 disposed above the contact plug 50.

As shown in FIG. 6B, the semiconductor layer 20B has a recess 20R contacting the contact plugs 40 and 50. Similarly, the semiconductor layers 20A and 20C also contact the contact plugs 40 and 50 at recesses 20R (not-illustrated).

The contact plugs 40 and 50 are formed inside the contact holes CH extending in the Z-direction through the insulating film 33. For example, the contact holes CH are provided inside the insulating film 33 using RIE (Reactive Ion Etching). In such a case, the recesses 20R are formed by selectively removing portions of the semiconductor layers 20A, 20B, and 20C.

In the example, the sizes in the Y-direction of the semiconductor layers 20A to 20C can be reduced because the contact plugs 40 and 50 are provided to contact the ends of the semiconductor layers 20A to 20C. In other words, in the semiconductor device 6, the footprint on the substrate 10 can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a substrate;
   a first semiconductor layer provided above the substrate, the first semiconductor layer extending in a first direction along a surface of the substrate and having a first end and a second end opposite to the first end;
   a second semiconductor layer disposed between the substrate and the first semiconductor layer, the second semiconductor layer extending in the first direction and having a first end and a second end opposite to the first end;
   a first conductor connected to the first end of the first semiconductor layer and the first end of the second semiconductor layer, the first conductor extending in a second direction crossing the surface of the substrate;
   a second conductor extending in the second direction and including a first portion and a second portion, the first portion being connected to the second end of the first semiconductor layer and being connected to the second end of the second semiconductor layer, the second portion being positioned inside the substrate;

an electrode facing a portion between the first end and the second end of the first semiconductor layer and facing a portion between the first end and the second end of the second semiconductor layer;

a first insulating film provided between the first semiconductor layer and the electrode; and a second insulating film provided between the second semiconductor layer and the electrode, wherein the second conductor extends into the substrate, and the second portion positioned inside the substrate is provided as one body with the first portion connected to the first semiconductor layer and to the second semiconductor layer.

2. The device according to claim 1, wherein the first conductor and the second conductor extend through the first ends and the second ends of the first semiconductor layer and the second semiconductor layer.

3. The device according to claim 1, wherein the first portion of the second conductor includes a material different from a material of the second portion of the second conductor.

4. The device according to claim 1, wherein the first semiconductor layer and the second semiconductor layer have recesses in portions contacting the first conductor and portions contacting the second conductor.

5. The device according to claim 1, further comprising a third insulating film provided between the substrate and the second semiconductor layer, the electrode being provided to surround the first semiconductor layer and the second semiconductor layer in a cross section crossing the first direction, the substrate being electrically insulated from the electrode by the third insulating film.

6. The device according to claim 5, wherein the second conductor extends through the third insulating film and extends into the substrate.

7. The device according to claim 5, wherein the third insulating film includes a portion positioned between the substrate and the first conductor.

8. The device according to claim 1, further comprising:
a first interconnect connected to the first conductor; and
a second interconnect connected to the second conductor,
the first conductor and the second conductor including metal material same as materials of the first interconnect and the second interconnect.

9. The device according to claim 8, further comprising a fourth insulating film covering the first semiconductor layer and the second semiconductor layer and being provided on the substrate, the first interconnect and the second interconnect being provided on the fourth insulating film.

10. A semiconductor device, comprising:

a substrate;

a first semiconductor layer provided above the substrate, the first semiconductor layer extending in a first direction along a surface of the substrate and having a first end and a second end opposite to the first end;

a second semiconductor layer disposed between the substrate and the first semiconductor layer, the second semiconductor layer extending in the first direction and having a first end and a second end opposite to the first end;

a first conductor connected to the first end of the first semiconductor layer and the first end of the second semiconductor layer, the first conductor extending in a second direction crossing the surface of the substrate;

a second conductor connected to the second end of the first semiconductor layer and connected to the second end of the second semiconductor layer, the second conductor extending in the second direction;

a heat sink provided inside the substrate and connected to the second conductor;

an electrode facing a portion between the first end and the second end of the first semiconductor layer and facing a portion between the first end and the second end of the second semiconductor layer;

a first insulating film provided between the first semiconductor layer and the electrode; and a second insulating film provided between the second semiconductor layer and the electrode.

11. The device according to claim 10, further comprising a third insulating film provided between the substrate and the second semiconductor layer, the electrode being provided to surround the first semiconductor layer and the second semiconductor layer in a cross section crossing the first direction, the substrate and the heat sink being electrically insulated from the electrode by the third insulating film.

12. The device according to claim 11, wherein the third insulating film includes a portion positioned between the substrate and the first conductor, and the second conductor extends through the third insulating film and is connected to the heat sink.

13. The device according to claim 10, wherein the heat sink includes a metal material filled into the substrate.

* * * * *